United States Patent [19]
Thompson et al.

[11] Patent Number: 5,990,981
[45] Date of Patent: Nov. 23, 1999

[54] MODULAR VIDEO SIGNAL MATRIX SWITCHER WITH COLOR-CODED COMPONENTS

[75] Inventors: Edwin S. Thompson, Campbell Hall; William A. Crable, II, Blauvelt, both of N.Y.; Albert Harding, Hamburg, N.J.

[73] Assignee: Sensormatic Electronics Corporation, Boca Raton, Fla.

[21] Appl. No.: 09/022,820

[22] Filed: Feb. 12, 1998

[51] Int. Cl.[6] .................................................. G04N 5/268
[52] U.S. Cl. ...................... 348/705; 439/488; 340/825.83
[58] Field of Search ................................... 348/705, 706, 348/722; 439/519, 521, 527, 532, 488, 489, 481, 713, 718; 340/825.83

[56] References Cited

U.S. PATENT DOCUMENTS

| | | | |
|---|---|---|---|
| 3,554,429 | 1/1971 | Cohen | 229/15 |
| 3,786,505 | 1/1974 | Rennie | 343/7 ED |
| 3,938,088 | 2/1976 | Clark | 340/146.3 B |
| 4,009,466 | 2/1977 | Clark | 340/146.3 B |
| 4,531,765 | 7/1985 | Shulman | 283/114 |
| 4,639,881 | 1/1987 | Zingler | 364/527 |
| 4,651,022 | 3/1987 | Cowley | 307/116 |
| 4,874,084 | 10/1989 | Strausser | 206/231 |
| 5,144,548 | 9/1992 | Salandro | 364/138 |
| 5,487,683 | 1/1996 | Carlson, Jr. | 439/718 |
| 5,661,631 | 8/1997 | Crane, Jr. | 361/683 |

OTHER PUBLICATIONS

Radio Shack New 1975–76 Unabridged Dictionary of Electronics, p. 106.

*Primary Examiner*—Victor R. Kostak
*Attorney, Agent, or Firm*—Robin, Blecker & Daley

[57] ABSTRACT

A modular video signal matrix switcher is constructed with a midplane architecture. The functional components of the system include a power supply board, a controller board, one or two output boards, an optional control signal generating board, and one or more switching boards. These components are contained within a housing which has a number of non-dedicated board placement slots. The non-dedicated slots can receive any one of a switching board, an output board or a camera control signal generating board. Each type of board component is assigned a respective distinguishing color pursuant to a color coding system. The color coding system facilitates configuration management, assembly and maintenance operations.

26 Claims, 9 Drawing Sheets

MODULAR VIDEO SIGNAL MATRIX SWITCHER WITH COLOR-CODED COMPONENTS

FIELD OF THE INVENTION

This invention is concerned with video signal switching equipment, and, more particularly, with such equipment formed of modular components.

BACKGROUND OF THE INVENTION

It is well known to provide closed circuit television surveillance systems in which video signals generated from a considerable number of video cameras are to be selectively distributed for display among a number of video monitors. In such systems, a video switching apparatus is connected between the cameras and the monitors to perform the signal distribution function.

The number of cameras and the number of monitors which customers desire to include in their surveillance systems are subject to considerable variation. Consequently, it is desirable that the switching apparatus be assembled from modular components, so that the switching capacity of the apparatus, and possibly other features, can be tailored to meet the customer's needs. However, assembly, diagnosis and maintenance of a modular video switching apparatus may present some difficulties. When the apparatus is to be assembled, the factory employee is usually presented with documents such as a configuration table and a bill of materials which are intended to indicate the number and types of components to be incorporated in the apparatus. Such documents refer to the components by designations such as part numbers and/or word descriptions of the components. Often the part numbers convey little or no information about the corresponding component, and the meanings of word descriptions can also be unclear. Moreover, it can be difficult to recognize the components by sight and to correctly match the components with the word or part number designations. As a result, assembling a modular system can be a complex and error-prone task. These problems are exacerbated by the large number of different configurations which may be possible, even when only a fairly small number of distinct components are used.

Other difficulties in identifying and referring to system components may be encountered during trouble-shooting or system maintenance operations For example, it is not unusual for an untrained person at the customer's location to be in telephone communication with a customer service representative. Attempts by the customer service representative to direct the untrained person to manipulate, remove or exchange system components may be seriously encumbered by the untrained person's unfamiliarity with part number and word designations for the system components, and/or inability on the part of the untrained person to match the designation to an actual component in the system. It also may be quite difficult for the customer service representative to provide a physical description of a particular system component in terms which will be understood by the untrained person.

It has been known to provide a video matrix switching device constructed from printed circuit board components contained in dedicated slots in the housing with color-coded designations on the housing to indicate what type of printed circuit board belongs in each slot. Corresponding color code indications were provided on the circuit boards to guide production workers to insert the circuit boards into the correct dedicated slot. However, this arrangement greatly restricted the number of different configurations of switcher that could be produced using a given type of housing.

OBJECTS AND SUMMARY OF THE INVENTION

It is an object of the invention to provide a fully modular video signal switching apparatus in which the components can be readily and unambiguously identified for the purpose of system assembly, diagnosis and maintenance.

It is a further object of the invention to provide an improved system for designating components in a modular video signal matrix switcher.

According to the invention, a video signal matrix switcher includes a housing which has a plurality of non-dedicated component placement locations and a plurality of different types of printed circuit board mounted in the housing for performing respective functions of the switcher. At least some of these printed circuit boards are positioned in respective ones of the non-dedicated component placement locations and include color coding indicia for distinguishing the boards from other types of boards mounted in the housing.

As used herein and in the appended claims, the term "non-dedicated component placement location" should be understood to mean a slot or other mounting location adapted to receive more than one type of printed circuit board or similar component. That is, a "non-dedicated component placement location" is adapted to hold only one component at a time but is not limited to holding components of only a single type.

According to another aspect of the invention, there is provided a method of assembling a video signal matrix switcher formed of a housing in which a plurality of non-dedicated component placement locations are provided for receiving a plurality of different types of printed circuit boards for performing respective functions of the switcher, the method including the step of color coding the different types of printed-circuit boards.

Further according to this aspect of the invention, the method may also include providing a computer which includes a display, inputting into the computer data indicative of a desired configuration of the matrix switcher, and displaying on the display a color-coded graphic representation of the desired configuration.

By providing color-coded printed circuit boards in a video matrix switcher, which has a number of non-dedicated component placement locations, it is possible to have a great deal of freedom in configuring the switcher to meet customer needs, while simplifying tasks such as assembling, maintaining, or diagnosing the system.

The foregoing and other objects, features and advantages of the invention will be further understood from the following detailed description of preferred embodiments and from the drawings, wherein like reference numerals identify like components and parts throughout.

DESCRIPTION OF PREFERRED EMBODIMENTS AND PRACTICES

Figure 1:
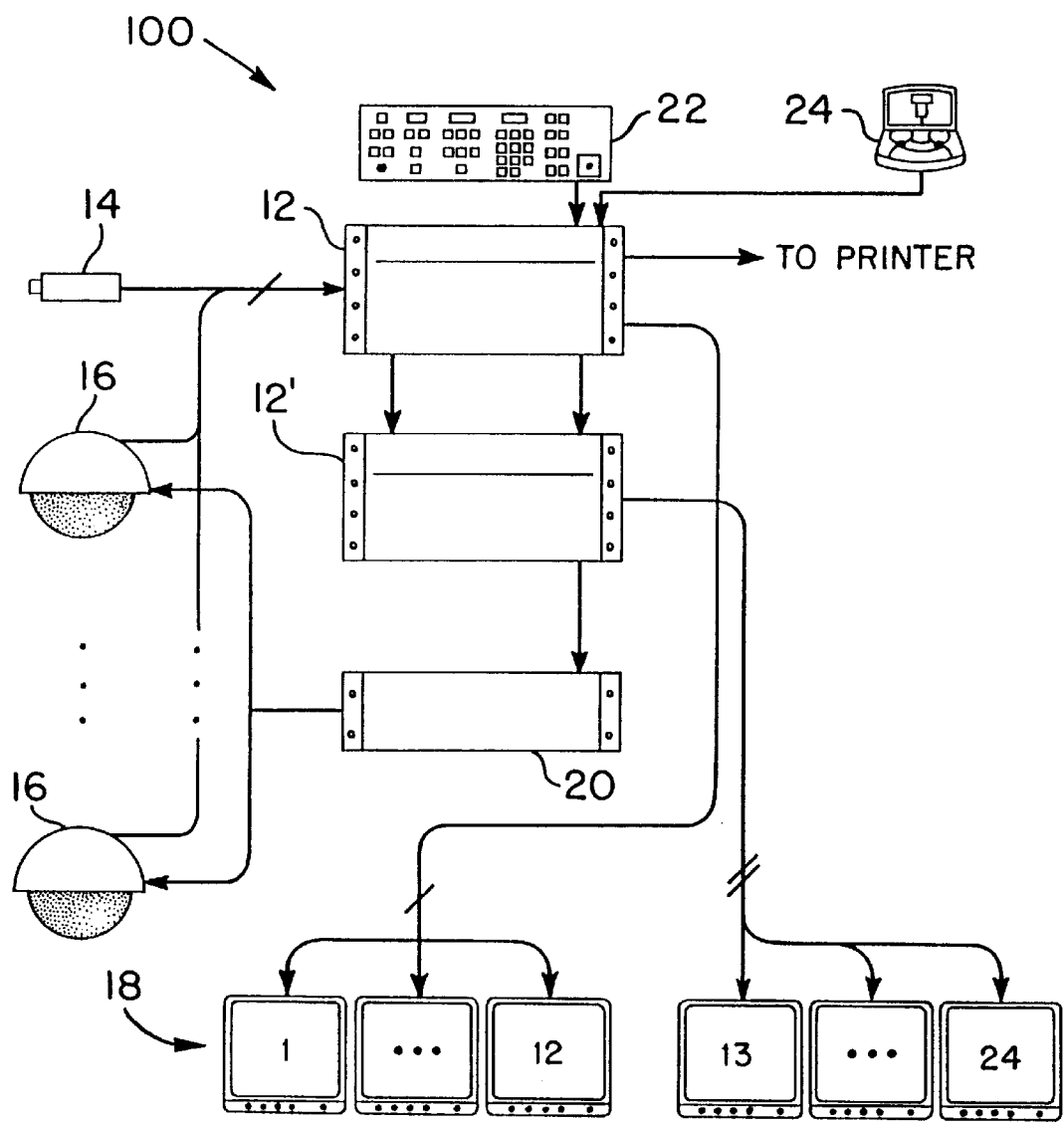
FIG. 1 is a block diagram of a closed circuit video surveillance system in which the matrix switcher of the present invention may be applied.

FIG. 1 provides an overview of a video surveillance system in which a modular video switcher provided in accordance with the invention may be applied.

Reference numeral 100 generally indcates the video surveillance system. At the heart of the system are a video signal matrix switcher 12 and a second, or slave, switcher 12'. Input for the switchers 12 and 12' is provided by a plurality of cameras, including one or more fixed cameras indicated at reference numeral 14, and a plurality of movable cameras 16 which may be conventional dome-housed cameras or other cameras having remotely controllable pan, tilt and zoom capabilities. The video signals provided by the cameras 14 and 16 are provided in parallel to the switchers 12 and 12'. Signals selected for output by the switchers 12 and 12' are respectively provided to monitors 18. Signals for controlling movement of the remotely controllable cameras 16 are generated at switcher 12 and/or 12', and are transmitted to the cameras 16 via a control code distribution module 20. Operation of the switcher 12 and 12' and of the entire video surveillance system is controlled through inputs provided by user interface devices, such as a keyboard 22 and a control pad 24.

It should be understood that, with the exception of the matrix switcher 12 and 12', all of the components of the system may be constituted by devices of known design.

An embodiment of a matrix switcher provided in accordance with the invention will now be described with reference to FIGS. 2–6.

Figure 2:
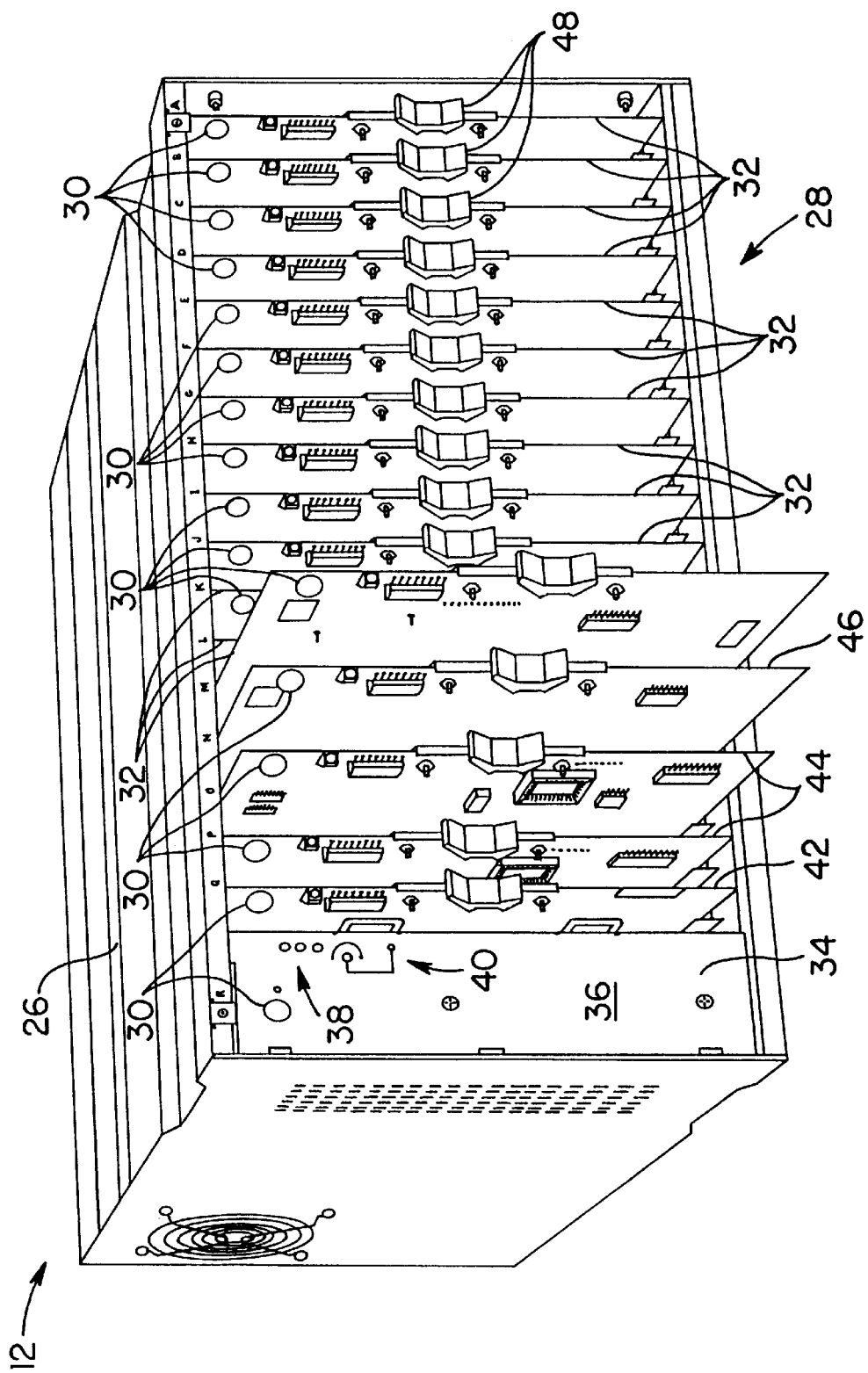
FIG. 2 is a perspective view of a matrix switcher provided according to the invention, showing the front side of the switcher.

A perspective view including the front side of the switcher 12 is provided in FIG. 2. The switcher 12 includes a housing 26, which may be formed of a conventional material such as metal or plastic. The housing 26 has an open front side 28 through which electronic components in the form of printed circuit boards may be inserted into or removed from the housing. The circuit board components removable through the open front 28 are of several distinct types, and each type of component is provided with a respective color coding indicia 30 in the form of a colored plastic bead mounted on the respective component.

In a preferred embodiment of the invention, the housing 26 includes spaces for eighteen separately removable components at the front side of the housing. In the configuration illustrated in FIG. 2 all spaces are filled, and the components shown include thirteen switching module boards which occupy the thirteen right-most spaces in the housing 26. The switching module boards are each indicated by the reference numeral 32. Each of the switching module boards 32 has circuitry to provide matrix switching between twelve video inputs and twelve output terminals. All thirteen of the switching module boards 32 are identical to each other, and the respective color coding indicator bead 30 on the switching module boards 32 has the color blue to identify the switching module boards. The circuitry provided on each switching module board 32 is formed from standard components and is laid out in accordance with conventional design principles; further description of the circuitry of the switching module boards 32 is not necessary for an understanding of the invention.

In the left-most space at the front of the housing 26 a power supply board 34 is provided. A panel 36 is mounted at a front edge (not shown) of the board 34. The power supply board 34 includes circuitry of conventional design (not shown) which converts an AC power line signal into suitable DC power levels for the electronic components of the switcher 12. In a preferred embodiment of the invention +8 VDC and –8 VDC are provided. The power supply board 34 also preferably includes circuitry for handling some of the data communications between the matrix switcher 12 and other components of the system.

The color coding indicator bead 30 mounted on the front panel 36 of the power supply board 34 is red to identify the power supply board. Also present on the front panel 36 of the power supply board 34 are indicator LED's 38. The front panel 36 also has access points 40 which permit a user to adjust, relative to the AC power signal, the phase of a video switching synchronization signal generated by the power supply board 34. The switching synchronization signal controls the timing at which the switching modules perform switching operations.

In the space immediately to the right of the power supply board 34 (as viewed in FIG. 2), a controller board 42 is provided. The color coding bead 30 of the controller 42 is purple. A microprocessor (element 43 in FIG. 4; not shown in FIG. 2) is mounted on the controller board 42 and generally controls the operations of the switcher 12. Among other functions, the microprocessor on the controller board 42 supervises operation of control circuits provided on the other printed circuit boards of the switcher 12.

Immediately to the right of the controller board 42, two output module boards 44 are provided. The output module boards 44 are interchangeable, and indeed are identical to each other, and the color coding beads 30 thereof are orange. Circuitry (which is not explicitly shown) is provided on the output module boards 44 to generate character video signals and to combine the character video signals with a video signal output from one of the switching module boards to form an output video signal in which desired text information is overlaid upon live video. In a preferred embodiment of the invention, each output module board 44 includes six text generation/output video channels.

Immediately to the right of the output module boards 44 (i.e. between the right-hand one of the two boards 44 and the left-most switching module board 32), a control code module board 46 is provided. The color coding bead 30 on the control code module board 46 is yellow. Circuitry provided on the board 46 is controlled by the microprocessor 43 on controller board 42 and generates control code signals which are transmitted from the switcher 12 to control movement (e.g., pan, tilt and zoom operations) of the remotely controllable cameras 16 (FIG. 1).

The circuits on the controller board 42, the output module boards 44 and the control code module board 46 are designed in accordance with conventional design principles and need not be further described to provide a full understanding of the invention.

As will be observed from FIG. 2, each of the printed circuit boards other than power supply board 40 has a handle mounted at a central portion of the outward edge of the board to aid in slidingly removing the board from the housing 26. The handles are preferably formed of white-colored plastic and several of the handles are indicated in FIG. 2 with reference numeral 48.

In a preferred embodiment of the switcher, at least the sixteen spaces not occupied by the boards 34 and 42 are non-dedicated in that any one of a switching module board, an output module board or a control code output board can be positioned in any one of the sixteen spaces. Consequently, the input capacity of the switcher can be increased by, for example, adding two more switching boards in place of the control code module board 46 and one of the output module boards 44. Further, depending on what sort of connections are provided among the board components, the output capacity of the switcher may be increased by replacing the control code module board and/or one or more of the switching boards with an output module board or boards.

Figure 3:
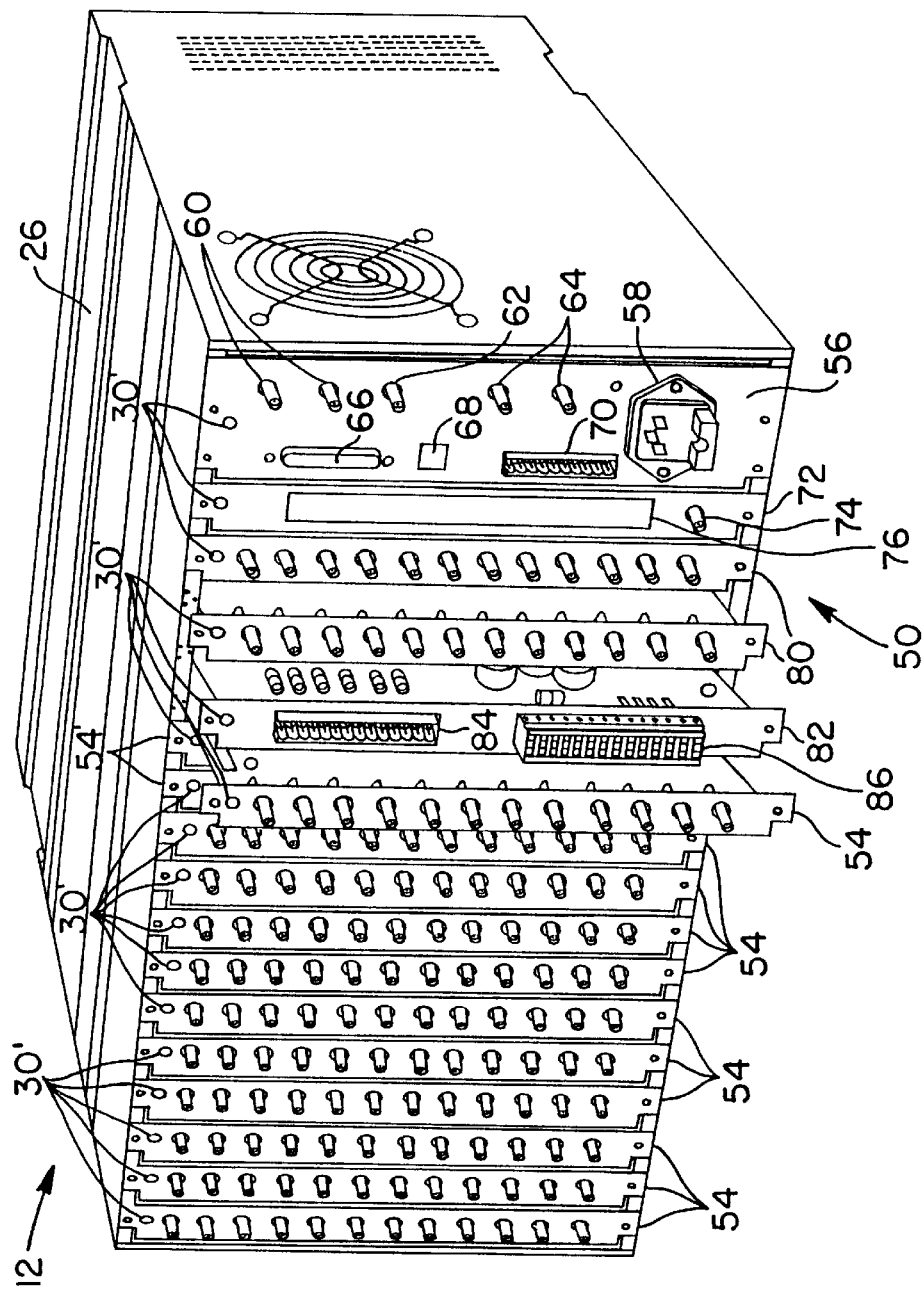
FIG. 3 is another perspective view of the switcher of FIG. 2, showing the rear side of the switcher.

FIG. 3 is a perspective rear view of the switcher 12, showing that the housing 26 of the switcher 12 has an open rear side 50 which has eighteen spaces through which circuit board structures may be slidingly inserted into and removed from the housing 26. Each of the boards shown in FIG. 3 (which will sometimes be referred to as "rear boards") is aligned with and connected to a corresponding one of the boards shown in FIG. 2. Connections between the front boards shown in FIG. 2 and the rear boards of FIG. 3 are provided by means of a midplane connecting structure 52 (FIG. 5) which will be discussed below.

Continuing to refer to FIG. 3, each of the rear boards shown therein has a color coding plastic bead 30' mounted at an upward portion of the outer face of the respective rear board. As will be seen, the color of each bead 30' is the same as the color of the color coding bead 30 of the corresponding front board with which the rear board is aligned.

To the left and center of the open rear side 50 of the housing 26 (as viewed in FIG. 3), thirteen rear input connector boards 54 are provided. Each of the boards 54 is aligned with and connected to a respective one of the switching module boards 32 (FIG. 2). Continuing to refer to FIG. 3, each of the rear input connector boards 54 has an outer face upon which 12 standard BNC-type connectors are mounted in a vertical column. As would be expected from the previous discussion, the color coding beads 30' of the rear input connector boards 54 are blue, matching the color coding beads 30 of the switching module boards 32. Collectively, the input connector boards 54 provide 156 input connectors to support 156 incoming video signal channels. Each board 54 provides 12 input channels for the 12×12 matrix switch circuit of the corresponding switching module board 32.

In the right-most space of the rear side 50 of housing 26, a rear power connection board 56 is provided. The rear power connection board 56 is aligned with, and connected to, the power supply board 34 which was discussed above. The color coding bead 30' mounted at the top of the outer face of the board 56 is red, matching the bead 30 of the power supply board 34. The connectors and receptacles provided on the outer face of the rear power connector board 56 include a three-prong receptacle 58 which is provided to receive a female plug of an AC power cord (not shown).

Also provided on the outer face of the rear power board 56 are BNC connectors 60 for providing a loop-through video signal path, a BNC connector 62 which serves as a data output port, and BNC connectors 64 which provide a loop-through signal path for a video synchronization signal received from an optional external device (not shown).

Also provided on the rear power connector board 56 are a printer output port 66, an ARCNET data port 68, and an auxiliary power input connection 70, which is provided to receive +8 V and −8 V DC power levels from an optional external back-up power supply (not shown).

Immediately to the left of the rear power connector board 46, a rear controller connector board 72 is positioned. The rear controller connector board 72 is aligned with and connected to the controller board 42 referred to above. The color coding bead 30' of the rear controller connector board 72 is purple, matching the color coding bead 30 of the controller board 42. The rear controller connector board 72 has a BNC connector 74 mounted on its outer face. The connector 74 functions as an output port for video signals generated on the controller board 42. These signals may be displayed on a monitor (not shown) to provide a system status display and/or a menu display to be used in programming the system.

Also provided on the outer face of the rear controller connector board 72 is a group of ten RJ45 connectors (reference numeral 76) to accommodate data communication between the controller board 42 and user interface devices and/or other external devices.

Immediately to the left of the rear controller connector board 72, two adjacent rear output connector boards 80 are positioned. Each of the output connector boards 80 is aligned with and connected to a respective one of the output module boards 44 which were discussed above. The color coding beads 30' on the boards 80 are orange, matching the color coding beads 30 of the boards 44. Each of the boards 80 has mounted on its outer face a vertical column of 12 BNC connectors. The connectors on each of the rear output boards 80 provide six output video channels by which live video signals selected by the switching boards 32 are output, after having been combined with text overlay signals generated at the front output boards 44. The other six BNC connectors on each board 80 are available to receive video signals from outside sources, upon which it is desired to overlay text characters generated by the circuitry of the respective output board 44. Thus, in effect, each board 80 provides six loop-through paths to accommodate text overlay on video signals from an external source by utilizing the electronics on the corresponding output board 44.

The eighteenth and last one of the rear boards is indicated by reference numeral 82 and is positioned between the right-most rear input connector board 54 and the left-hand one of the rear output connector boards 80. The board 82 can be referred to as a rear control code output board and is aligned with and connected to the control code module board 46 which was discussed above. As will by now be understood, the color coding bead 30' on the rear control code output board 82 is yellow, matching the color coding bead 30 on the board 46. Groups of data ports 84 and 86 are provided on the outer face of the rear board 82 to accommodate data communication between the control code module board 46 (FIG. 2) and external devices, which are not shown in FIG. 3, but may include remotely controllable cameras, alarm sensors, and other types of devices.

Figure 4:
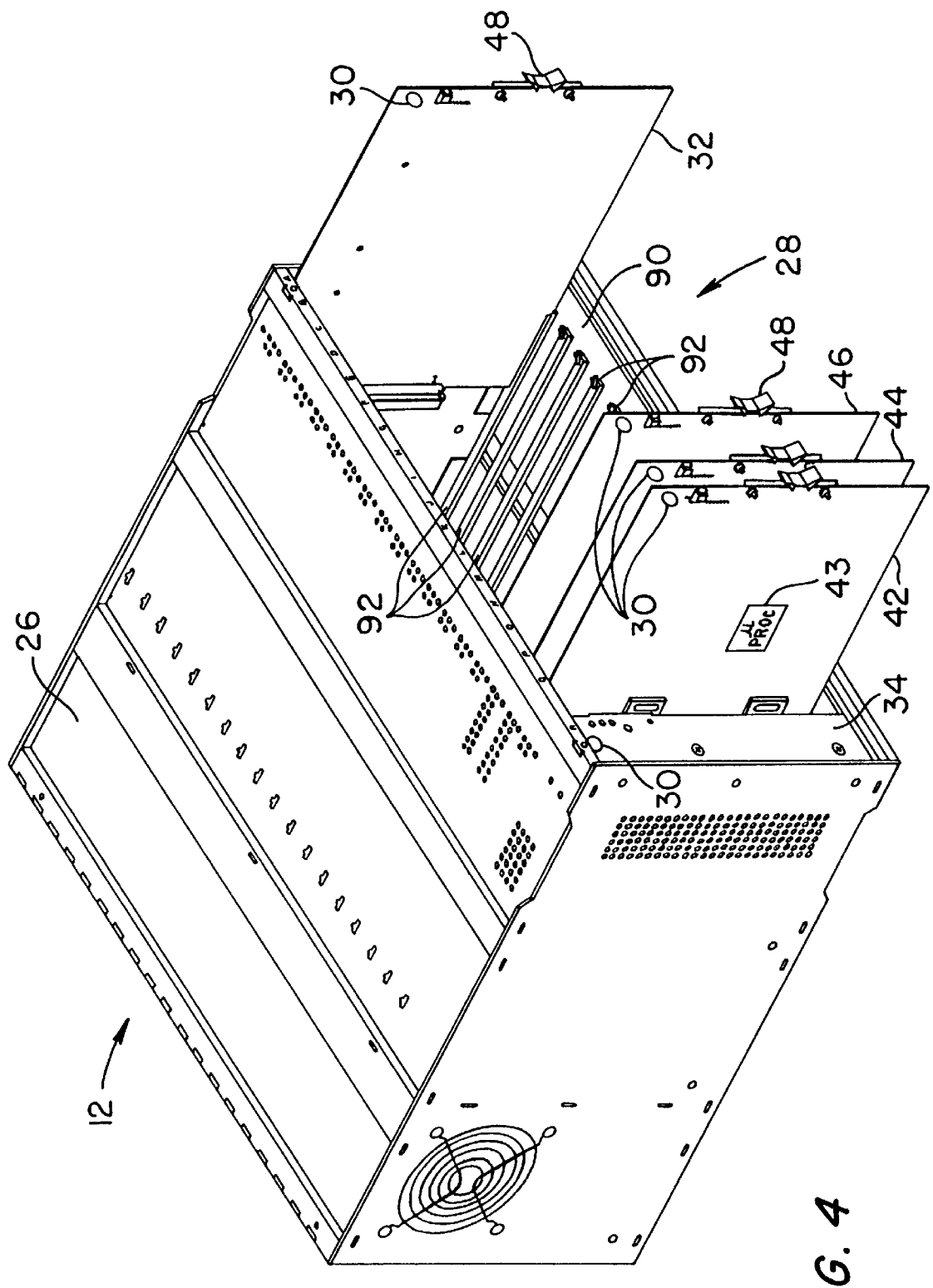
FIG. 4 is a perspective view similar to FIG. 3, but with many of the system components removed so that a portion of the interior of the switcher is visible.

FIG. 4 is a perspective front view which is similar to FIG. 2, except that in the view of FIG. 4 many of the front printed circuit boards (including all but one of the switching module boards 32) have been removed, to permit a partial view of the inside of the housing 26. (Also, in the representation of FIG. 4, the boards that remain are represented somewhat schematically, and without any detail of the circuitry carried on those boards.) As seen from FIG. 4, the housing 26 has a floor 90. A plurality of slots 92 (of which only 5 are visible in FIG. 4) are positioned on the floor 90 of the housing 26 and extend in the direction from the open front 28 of the housing toward the rear of the housing. The slots are provided to facilitate sliding insertion and removal of the front printed circuit boards into and from the housing 26, so that in effect, a frame structure is provided for the printed circuit boards.

Figure 5:
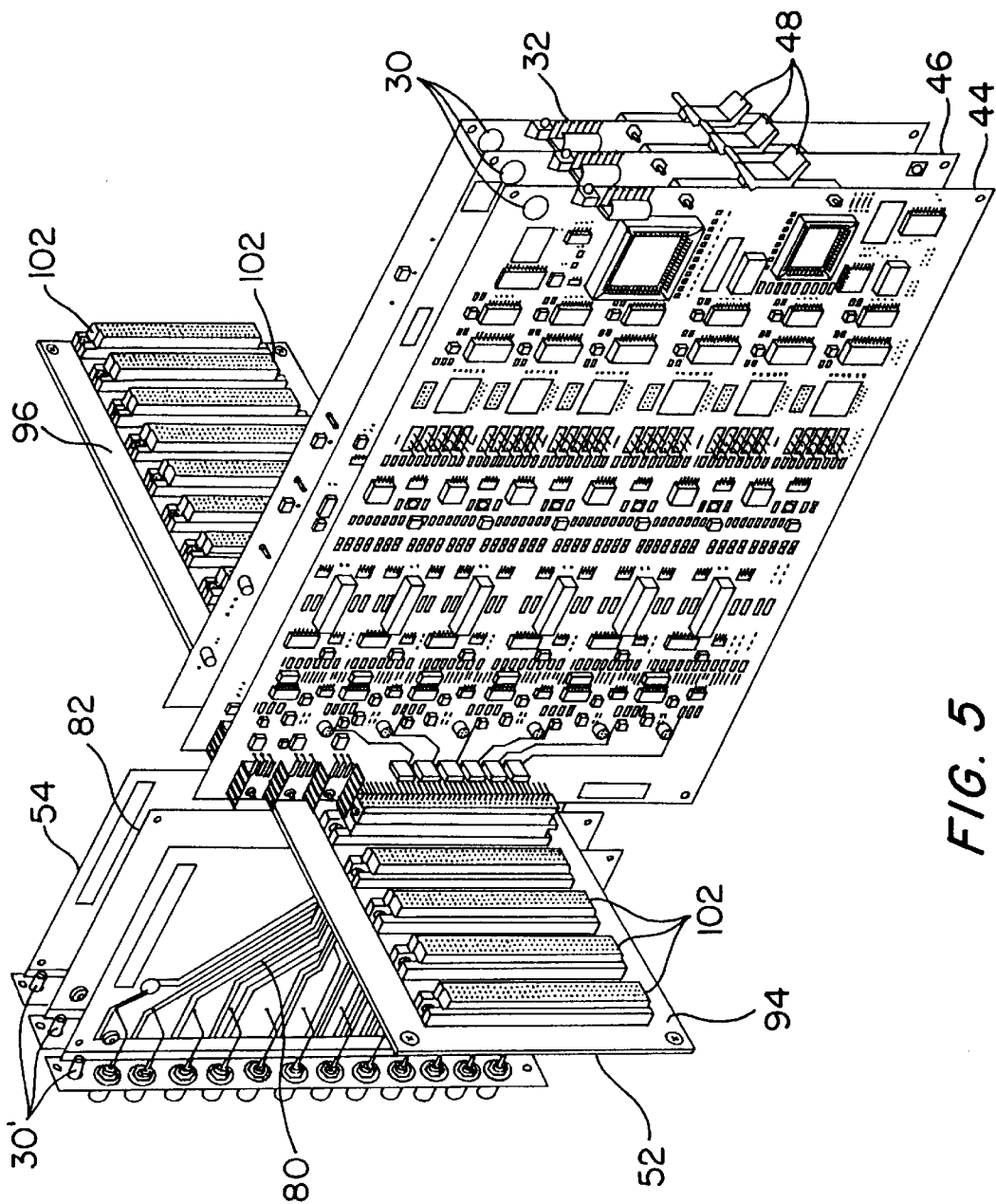
FIG. 5 is a perspective view showing a small subset of the printed circuit board components of the switcher of FIG. 2, together with a midplane connecting structure which provides electrical connections among the printed circuit board components.

FIG. 5 shows certain selected components of the switcher 12, with the housing 26 removed, and the selected components arranged to illustrate the manner in which the midplane connecting structure 52 provides connections among all thirty-six of the board components that have previously been referred to. The specific components shown in FIG. 5, in addition to the midplane structure 52, are a switching module board 32, a control code module board 46, an output module board 44, a rear input connector board 54, a rear control code output board 82, and a rear output connector board 80.

Figure 6:
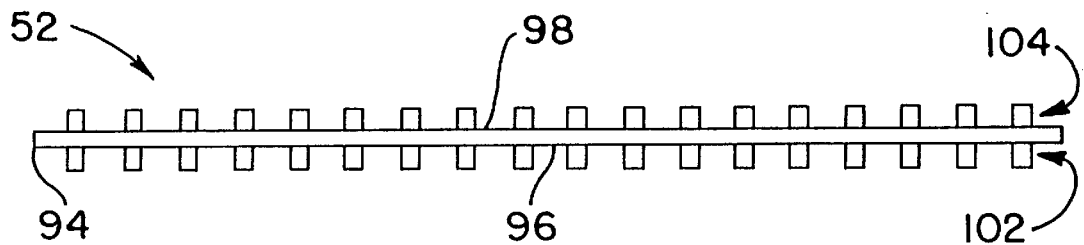
FIG. 6 is a top plan view of the midplane structure of FIG. 5.

The main component of the midplane structure 52 is a generally planar and rectangular board member 94 which has opposite faces 96 and 98 (see FIG. 6, which is a somewhat schematic top plan view of the midplane structure alone). Mounted along each of the opposed faces 96 and 98 of the board number 94 is a plurality of standard connectors provided for electrical connection with edge connectors provided on the printed circuit boards of the switcher 12. In a preferred embodiment of the invention, eighteen 96-pin DIN female connectors 102 are mounted along face 96 to accommodate electrical connection with edge connectors provided at the rear ends of the front printed circuit boards of the switcher 12. Provided on the rear face 98 are eighteen 96-pin DIN male connectors 104 (FIG. 6, not visible in FIG. 5), to accommodate edge-connection with the rear boards of the switcher 12.

Preferably some of the pin positions in the connectors 102 are arranged to provide a code indication so that each of the front boards can "read" its position within the housing and then can respond appropriately to address signals.

Internal to the board member 94, wiring (which is not visible in the drawings) is provided both laterally among the connectors 102 on the front side of the midplane structure 52, and in the front-to-rear direction, so that connections are made between each connector 102 and the corresponding connector 104 which is mounted directly opposite the respective connector 102.

The lateral connections provided by the mid-plane 52 preferably include at least twelve parallel video output bus connections among the eighteen connectors 102, as well as address and serial data bus connections.

FIG. 5 also illustrates the arrangements, discussed above, whereby each of the rear boards is aligned with and connected to a corresponding front board. Specifically, FIG. 5 shows rear output connector board 80 aligned with (i.e., substantially coplanar with) output module board 44, rear control code output board 82 aligned with control code module board 46, and rear input connection board 54 aligned with switching module board 32. Also, the midplane structure 52 serves to provide a signal path between board 80 and board 44; a signal path between board 82 and board 46; and a signal path between board 54 and board 32. It should be understood that the arrangement illustrated by FIG. 5 also applies to all eighteen pairs of front and rear boards of the switcher 12.

It is to be understood that the configuration of switcher 12 shown in FIGS. 2 and 3 contains the maximum number of components for the housing shown in those drawings. In many cases the switcher may be assembled without some of the components shown in FIGS. 2 and 3. For example, it is contemplated to omit some but not all of the switching module boards 32 (and the corresponding rear boards). Also, one of the two output module boards 44, and its corresponding rear board, may be omitted. Also, the control code module board 46 and its corresponding rear board may be dispensed with, if only fixed cameras are included in the video surveillance system, or if other means, independent of the switcher 12, are provided for generating control codes to control any movable cameras in the surveillance system.

A much sparser, though not quite minimal, configuration of the switcher 12 is shown in FIG. 4, consisting of the power supply board 34 and the controller board 42, only one each of the switching module boards 32 and output module boards 44, plus the control code module board 46. If the control code module board 46 were eliminated from the configuration shown in FIG. 4, then a minimum configuration would be present. It will be recognized that many alternative configurations intermediate between the fully populated configuration of FIGS. 2 and 3 and the near minimal configuration of FIG. 4 are possible.

Figure 7:
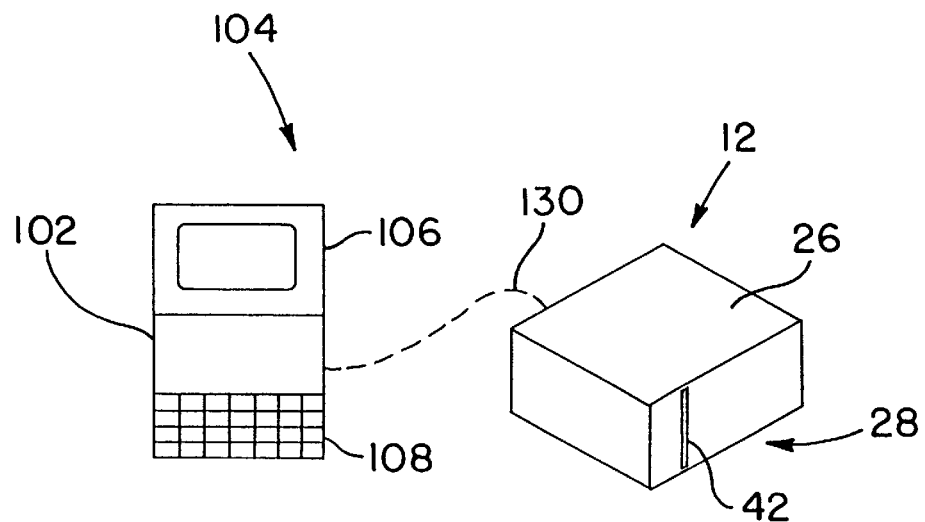
FIG. 7 schematically illustrates an arrangement for providing automated guidance during assembly of the switcher of FIG. 2.

There will now be described, with reference to FIGS. 7 to 11, practices provided in accordance with the invention for assembling the video signal matrix switching apparatus disclosed herein. Referring initially to FIG. 7, a computer 102 may be provided at an assembly station 104. The computer 102 may be constituted by standard personal computer hardware, and includes a display 106 and a keyboard 108. Software provided in accordance with the invention is installed in the computer 102 and controls the computer 102 to provide displays which will be discussed below.

Data representing configurations of one or more switchers to be assembled at station 104 is loaded into the computer 102 from, for example, a data disk (not shown), or by downloading from a host computer (not shown). The production worker (not shown) at the station 104 then operates the computer 102 to call up the configuration data for the first switcher to be assembled. In response, the display 106 presents a screen display such as that illustrated in FIG. 8.

Figure 8:
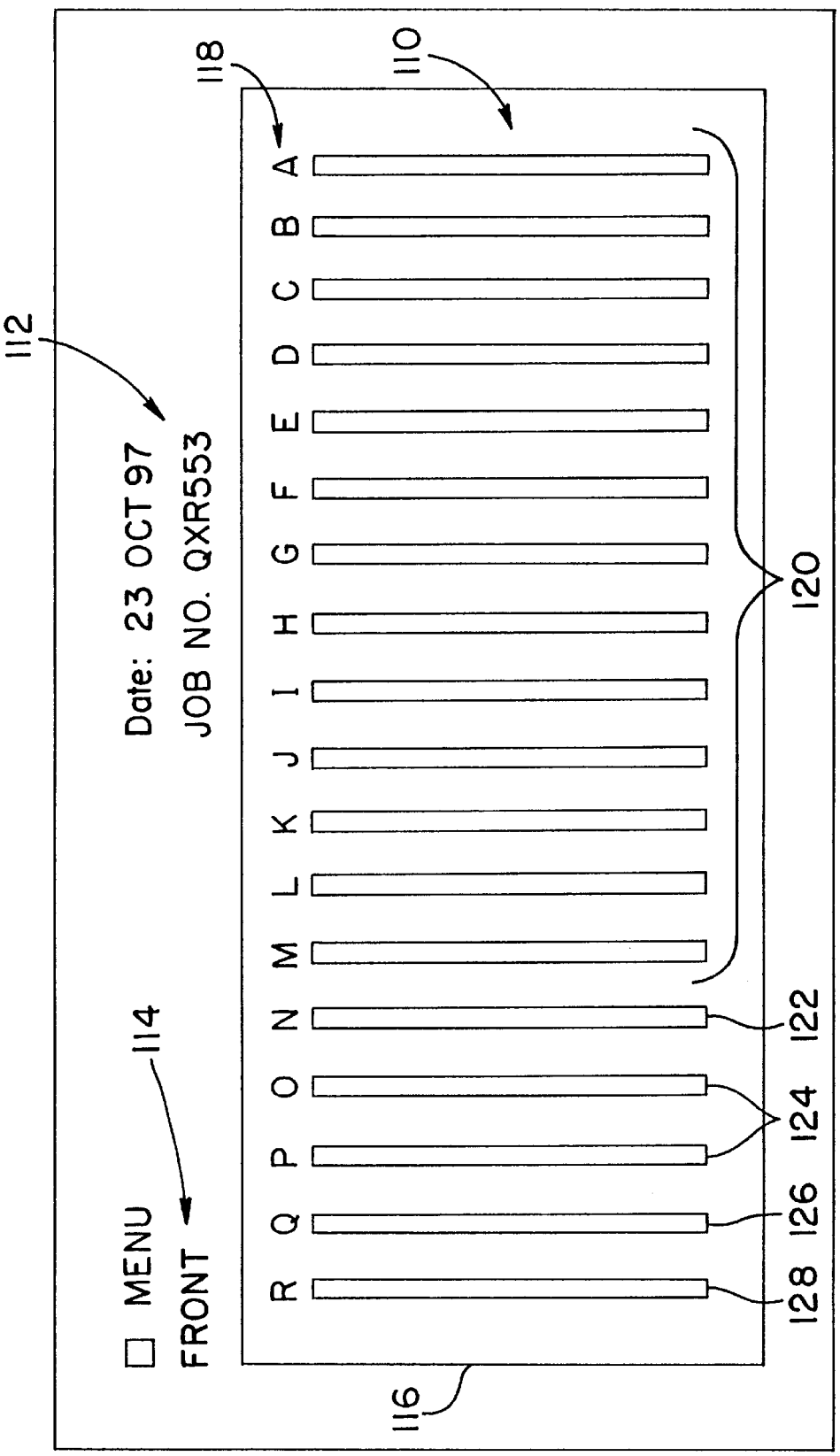
FIGS. 8–10 illustrate examples of screen displays that may be provided during assembly of the switcher.

Generally, the display of FIG. 8 is a schematic representation of the front side 28 of the switcher housing 26. A sequence of colored bars 110 in the display are indicative of the types and locations of the printed circuit board components called for by the configuration data for the job at hand. Job identification data and other information is displayed at 112. Provided at 114 is an indication that the display is for assembly of the front components of the switcher. Rectangular box 116 schematically corresponds to the open front side of the switcher housing. A sequence 118 of letters A through R runs from right to left along an upper portion of the box 116 and corresponds to lettering provided on the housing 26 to indicate the eighteen component placement locations at the front of the housing. The display bars 110 are colored and positioned relative to letter sequence 118 according to the configuration data for the job at hand.

For the purposes of the present example, it is assumed that the configuration data calls for a switcher configured as illustrated in FIGS. 2 and 3. Consequently, the colored bars 110 are eighteen in number, corresponding to each of the eighteen component placement locations. The thirteen right-most bars 120, corresponding to placement locations A–M, are all blue, to indicate that switching module boards (color-coded blue) are to be installed in the corresponding slots in the housing. The next colored bar 122, at position N in the display, is yellow, calling for installation of a control code module board at the corresponding slot in the housing. Proceeding to the left, the next two colored bars 124 are orange, indicating that output module boards are to be installed in the corresponding positions in the housing. The last two bars 126, 128 are respectively purple and red, to indicate that a controller board and a power supply board go in the last two slots.

It will be understood that the production worker, guided by the display of FIG. 8, proceeds to select component boards by referring to the color coding indicia thereof and then populates the front side of the switcher so as to match the sequence of colored bars 110 on the display. The production worker then calls up the display for the rear side of the switcher, which is illustrated in FIG. 9.

Figure 9:
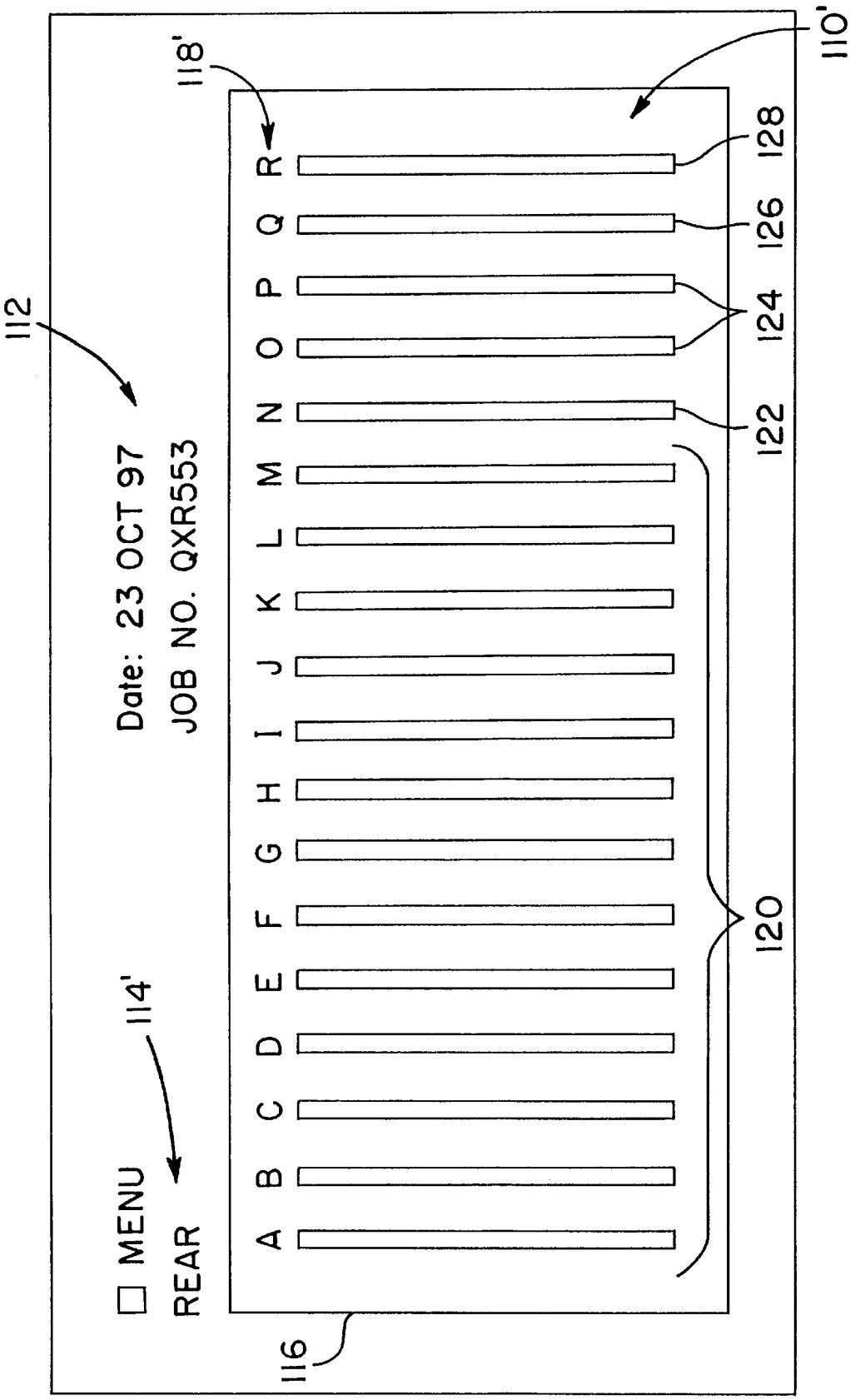

The display of FIG. 9 is similar to that of FIG. 8, except that the sequence of colored bars is reversed to form a sequence 110', the sequence of letters 118' runs from left to right, not right to left, and the indication 114 indicates 'Rear' rather than 'Front'. Proceeding from left to right in the colored bar sequence 110' in FIG. 9, thirteen blue bars 120 are followed by a yellow bar 122, two orange bars 124, a purple bar 126 and a red bar 128. This display guides the production worker to populate the component placement locations of the rear side of the switcher, from left to right, with thirteen rear input connector boards, a rear control code output board, two output connector boards, a rear controller connector board and a rear power connector board. As with the front components, the production worker refers to the color coding indicia on the rear boards while selecting the rear boards for insertion into the rear side of the housing.

Figure 10:
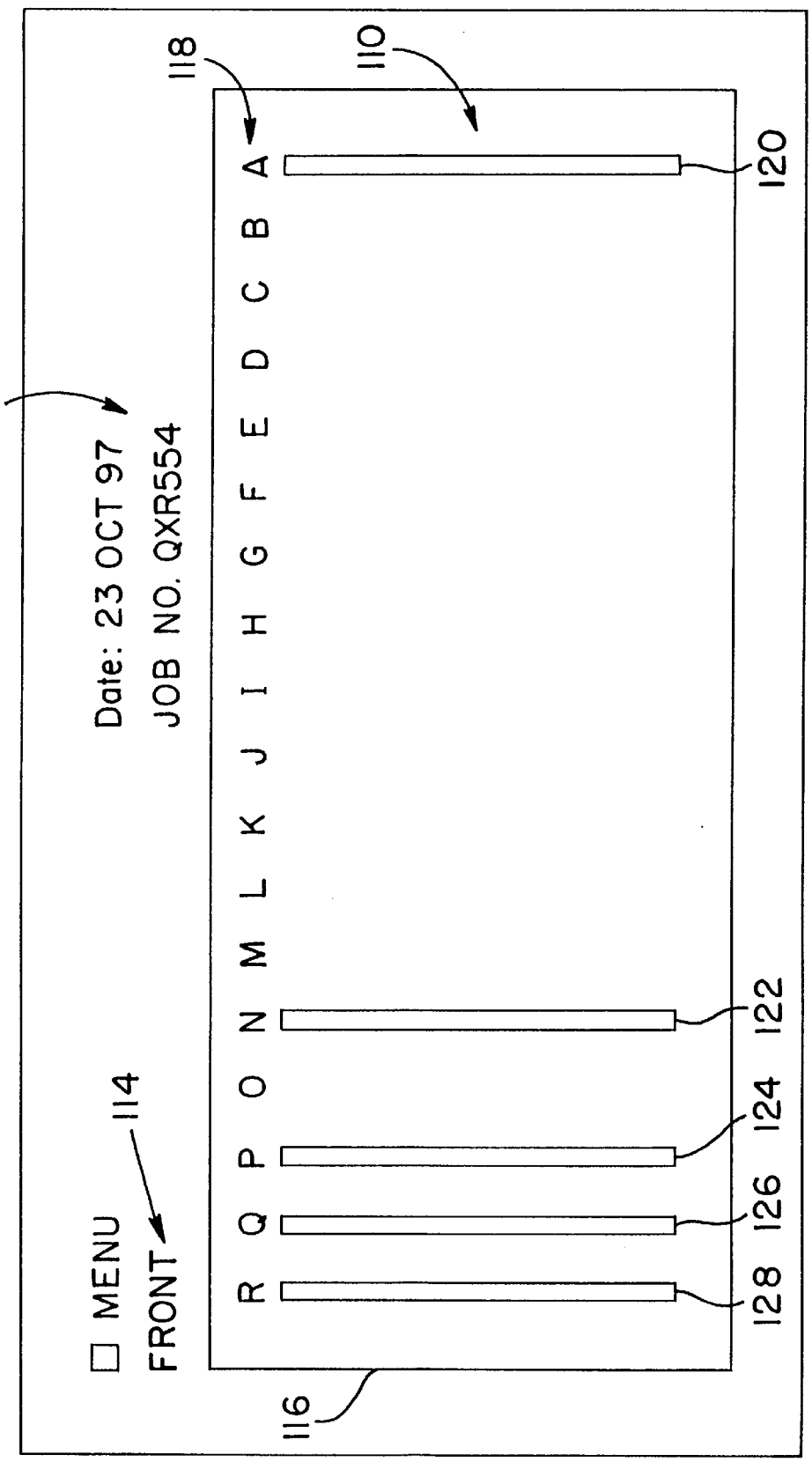

Another example of configuration data displayed by the computer 102 is illustrated in FIGS. 10 and 11. In this example the desired configuration is assumed to correspond to the sparse embodiment shown in FIG. 4.

Referring to FIG. 10, it will be observed that only five colored bars are displayed, namely a blue bar 120 at position A, a yellow bar 122 at position N, an orange bar 124 at position P, a purple bar 126 at position Q, and a red bar 128 at position R. The absence of bars at the other positions in the display indicates that the corresponding component placement positions in the housing are not to be populated.

FIG. 11 is the rear component display corresponding to the front component display of FIG. 10. In the display of FIG. 11, the colored bar sequence of FIG. 10 is duplicated in reverse.

It is contemplated to use the computer 102 to automatically audit assembly of the switcher. For this purpose a data communication path (represented by dashed line 130 in FIG. 7) may be provided between the computer 102 and the switcher 12 (shown schematically in FIG. 7) to permit exchange of data between the computer 102 and the microprocessor 43 (FIG. 4; not shown in FIG. 7) on controller board 42 of switcher 12. After assembly is complete (or even while assembly is occurring) the controller board microprocessor transmits to computer 102 data indicating the types and locations of the boards installed in the switcher 12. The computer 102 compares the data transmitted by the controller board microprocessor with the desired configuration data. If there is a discrepancy, a suitable indication of the discrepancy is provided on the display 106. For example, a screen display like those of FIGS. 8–11 may be provided, and if the data transmitted from the controller board to the computer 102 indicates that the wrong type of component was installed at a particular location, the colored bar at that location may be caused to flash. If a component is installed at a location that was intended to be left unpopulated, a flashing black bar may be displayed at the corresponding part of the screen display.

In the embodiments of the invention described hereinabove, it was found expedient to apply color coding to the system component boards by mounting thereon plastic beads of appropriate colors. However, other methods of applying colored indicia to the system component boards are contemplated. For example, colored stickers could be applied instead of or in addition to the plastic beads shown in the drawings. Alternatively, color could be applied by silk screening the white plastic handles 48, or by using handles formed of plastic that has been pre-dyed in the appropriate colors.

The midplane structure 52 referred to above was provided as an efficient way of interconnecting the system module boards. However, other interconnection techniques are contemplated including suitable ribbon cabling, and/or a conventional back plane connecting structure. If a back plane were adopted, it is contemplated that some or all of the rear boards would be eliminated or combined with the front boards.

The housing 26 illustrated herein is sized to accommodate 18 boards at its front side (a total of 36 boards including rear connector boards), but it is contemplated to provide a smaller or larger housing to accommodate a smaller or larger number of boards, with a corresponding decrease or increase in switching capacity.

It has been found that the board color coding system disclosed herein greatly facilitates the management of the various configurations of the disclosed video signal matrix switch. Instructional documents deploying color graphics can be produced to aid in training production workers and maintenance and support personnel. The availability of color coding on the system components, and reference to the colors in documents, significantly simplifies the task of assembling a specific configuration in response to an order documented on paper. The color codes form a convenient short-hand for both oral and written communication and are especially helpful when it is desired to provide telephonical consultation in regard to troubleshooting or remedial maintenance. In both assembly and maintenance tasks, presence of the color coding indicia aids in reducing the time required to perform the tasks and the risk of error. Also described herein is a computer-based system which uses the color coding system to guide production workers through assembly operations.

The presence of the color coding indicia also makes it possible, in many cases, to determine at a glance whether or not a complete and correct configuration has been assembled.

It is to be understood that various changes in the above-described apparatus and practices may be introduced without departing from the invention. The particularly preferred apparatus and practices are thus intended in an illustrative and not limiting sense. The true spirit and scope of the invention is set forth in the following claims.

What is claimed is:

1. In a video signal matrix switcher which includes a housing in which a plurality of non-dedicated component placement locations are provided, and the switcher also including a plurality of different types of printed circuit boards mounted in said housing for performing respective functions of the switcher, at least one printed circuit board of said plurality of different types of printed circuit boards being positioned in a respective one of said non-dedicated component placement locations, the improvement wherein said at least one printed circuit board in said non-dedicated component placement location includes a color coding indicia mounted on said at least one printed circuit board for distinguishing said at least one printed circuit board from other types of circuit boards mounted in said housing.

2. The invention according to claim 1, wherein said plurality of different types of printed circuit boards includes three different types of printed circuit board, each of said three different types of printed circuit boards having a respective color coding indicia that is different in color from the color coding indicia of the other types of printed circuit boards.

3. The invention according to claim 2 wherein said plurality of different types of printed circuit boards include:
a switching module board including circuitry for selectively connecting input terminals of the board with output terminals of the board, said switching module board having a color coding indicia of a first color;
an output module board including circuitry for generating a character video signal and for combining the character video signal with a video signal output from the switching module board, said output module board having a color coding indicia of a second color different from the first color;
a controller board having a microprocessor which controls operation of said switching module board and said output module board, said controller board also having color coding indicia of a third color different from said first and second colors; and
a power supply board having circuitry for converting an AC line power signal into at least one DC power level, said power supply board including color coding indicia of a fourth color different from said first, second and third colors;
the switcher also including means for interconnecting said switching module board, said output module board, said controller board, and said power supply board.

4. The invention according to claim 3, wherein the switcher also includes at least one other switching module board mounted in said housing, all of said switching module boards being substantially identical to each other and each having a color coding indicia of said first color.

5. The invention according to claim 3, wherein the switcher also includes a control code module board mounted in said housing and including circuitry for generating control signals for controlling movement of remote video cameras, said control code module also having color coding indicia of a fifth color different from said first, second, third and fourth colors.

6. The invention according to claim 1, wherein said plurality of non-dedicated component placement locations includes at least eight non-dedicated component placement locations.

7. The invention according to claim 6, wherein said plurality of non-dedicated component placement locations includes sixteen non-dedicated component placement locations.

8. A method of assembling a video signal matrix switcher formed of a housing in which a plurality of non-dedicated component placement locations are provided for receiving a plurality of different types of printed circuit boards, said printed circuit boards, for performing respective functions of the switcher, the method comprising the step of color coding said different types of printed circuit boards.

9. A method according to claim 8, further comprising the steps of:
providing a computer which includes a display;
inputting configuration data into said computer, the configuration data being indicative of a desired configuration of said matrix switcher; and
displaying on said display a color-coded graphic representation of said desired configuration.

10. A method according to claim 9, wherein the plurality of different types of printed circuit board includes:
a switching module board including circuitry for selectively connecting input terminals of the board with output terminals of the board, said switching module board having an indicia of a first color;
an output module board including circuitry for generating a character video signal and for combining the character video signal with a video signal output from the switching module board, said output module board having an indicia of a second color different from the first color;
a controller board having a microprocessor which controls operation of said switching module board and said output module board, said controller board also having an indicia of a third color different from said first and second colors; and
a power supply board having circuitry for converting an AC line power signal into at least one DC power level, said power supply board including an indicia of a fourth color different from said first, second and third colors;
and the method further comprising the steps of:
mounting said controller board in said housing;
establishing a data communication path between said computer and said microprocessor; and
transmitting from said microprocessor to said computer data indicative of the types and locations of printed circuit boards mounted in said housing.

11. A method according to claim 10, further comprising the steps of:
comparing said configuration data with said data transmitted from said microprocessor to said computer to detect discrepancies between said configuration data and said data transmitted from said microprocessor to said computer; and
displaying on said display a graphic representation of the discrepancies between said configuration data and said data transmitted from said microprocessor to said computer.

12. A method according to claim 8, wherein the housing has a first plurality of non-dedicated component placement locations at a first side of the housing and a second plurality of non-dedicated component placement locations at a second side of the housing, each of the locations of the second plurality being aligned with a corresponding location of the first plurality, the method further comprising the steps of:
positioning ones of said circuit boards in respective ones of the first plurality of non-dedicated component placement locations, each of said circuit boards in the locations of the first plurality having a color coding indicia; and selecting, for positioning in each of the non-dedicated component placement locations of the second plurality which correspond to said ones of the first plurality of non-dedicated component placement locations, a circuit board having a color coding indicia which matches the color coding indicia of the circuit board in the corresponding one of the first plurality of non-dedicated component placement locations.

13. A method according to claim 12, wherein all of the circuit boards selected for positioning in said second plurality of locations are different from the circuit boards in said first plurality of locations.

14. A video signal matrix switcher, comprising
a frame structure;
a first plurality of printed circuit boards mounted in said frame structure and arranged in a first row, the first plurality of printed circuit boards including:
  a plurality of switching module boards, all of said switching module boards being substantially identical to each other, and each switching module board including circuitry for selectively connecting input terminals of the board with output terminals of the board, each of the switching module boards having an indicia of a first color;
  at least one second printed circuit board that is substantially different from said switching module boards and has an indicia of a second color that is different from said first color; and
  a third printed circuit board that is substantially different from said switching module boards and from said at least one second printed circuit board, said third printed circuit board including an indicia of a third color different from said first and second colors; and
a second row of printed circuit boards arranged parallel to and spaced from said first row of printed circuit boards, said second row including:
  a plurality of first rear printed circuit boards each positioned opposite a respective one of said switching module boards, each of said rear printed circuit boards including an indicia of said first color;
  at least one second rear printed circuit board, positioned opposite said at least one second printed circuit board, said at least one second rear printed circuit board being different from said first rear printed circuit boards and including an indicia of said second color; and
  a third rear printed circuit board positioned opposite said third printed circuit board, said third rear printed circuit board being different from said first rear printed circuit boards and from said second rear printed circuit boards, and including an indicia of said third color;
  said matrix switcher further including means for interconnecting said circuit boards.

15. A video signal matrix switcher according to claim 14, wherein said means for interconnecting includes a midplane structure formed of a generally planar board having opposite sides on each of which a plurality of connectors is mounted.

16. A video signal matrix switcher according to claim 14, wherein a total of at least eight printed circuit boards are mounted in said frame structure.

17. A video signal matrix switcher according to claim 16, wherein a total of at least twenty-four printed circuit boards are mounted in said frame structure.

18. A video signal matrix switcher according to claim 17, wherein a total of thirty-six printed circuit boards are mounted in said frame structure.

19. A video signal matrix switcher according to claim 14, wherein:
  the second printed circuit board includes means for generating a character video signal and combining the character video signal with a video signal output from one of the switching module boards; and
  the third printed circuit board has mounted thereon a microprocessor which controls operation of said switching module boards and said second printed circuit board;
  the matrix switcher further comprising a power supply board mounted in said frame structure in said first row of printed circuit boards, said power supply board having mounted thereon means for converting an AC line power signal into at least one DC power level, said power supply board including an indicia of a fourth color different from said first color, said second color and said third color.

20. A video matrix switcher according to claim 19, wherein each of said switching module boards includes means for switchingly connecting twelve input video signals with twelve output terminals, and each of said first rear printed circuit boards has twelve BNC connectors, each for receiving an input video signal.

21. A video signal matrix switcher according to claim 19, wherein the matrix switcher further comprises a control code module board mounted in said frame structure in said first row of printed circuit boards, said control code module board including means for generating control signals for controlling movement of remote video cameras, said control code module board also including an indicia of a fifth color different from said first, second, third and fourth colors.

22. A video signal matrix switcher according to claim 21, wherein:
  said first dolor is blue;
  said second color is orange;
  said third color is purple;
  said fourth color is red; and
  said fifth color is yellow.

23. A video signal matrix switcher, comprising:
  a housing;
  a midplane structure positioned inside said housing between front and rear sides of said housing, said midplane structure including a generally planar member having a first side oriented towards the front side of said housing and a second side oriented towards the rear side of said housing, said midplane structure also including a first plurality of connectors mounted on said first side of said planar member, a second plurality of connectors mounted on said second side of said planar member, and means for interconnecting said connectors;
  a plurality of switching, module boards, each connected to a respective one of said first connectors and extending towards the front side of said housing and including circuitry for selectively connecting input terminals of the board with output terminals of the board, each of the switching module boards having an indicia of a first color;
  a plurality of first rear boards, each aligned with a respective one of said switching module boards and connected to a respective one of said second plurality of connectors and extending towards the rear side of said housing, each of said first rear boards having an indicia of said first color;

an output module board connected to a respective one of said first connectors and extending towards the front side of said housing and including circuitry for generating a character video signal and for combining the character video signal with a video signal output from one of the switching module boards, the output module board having an indicia of a second color different from the first color;

a second rear board aligned with the output module board and connected to a respective one of the second plurality of connectors and extending towards the rear side of said housing, said second rear board having an indicia of said second color;

a controller board connected to a respective one of said first connectors and extending towards the front side of said housing, said controller board having mounted thereon a microprocessor which controls operation of said switching module boards and said output module board, said controller board also having an indicia of a third color different from said first and second colors;

a third rear board aligned with the controller board and connected to a respective one of the second plurality of connectors and extending towards the rear side of said housing, said third rear board having an indicia of said third color;

a power supply board connected to a respective one of said first connectors and extending towards the front side of said housing, said power supply board having mounted thereon circuitry for converting an AC line power signal into at least one DC power level, said power supply board including an indicia of a fourth color different from said first, second and third colors; and a fourth rear board aligned with the power supply board and connected to a respective one of the second plurality of connectors and extending towards the rear side of said housing, said fourth rear board having an indicia of said fourth color.

24. A matrix switcher according to claim 23, further comprising:

a control code module board connected to a respective one of said first plurality of connectors and extending towards the front side of said housing, said control code module including circuitry for generating control signals for controlling movement of remote video cameras, and said control code module also having an indicia of a fifth color different from said first, second, third and fourth colors; and a fifth rear board aligned with said control code module and connected to a respective one of said second plurality of connectors and extending towards the rear side of said housing, said fifth rear board having an indicia of said fifth color.

25. A matrix switcher according to claim 23, further comprising:

an additional output module board substantially identical to said output module board and connected to a respective one of said first connectors and extending towards the front side of said housing, said additional output module board having an indicia of said second color; and an additional second rear board aligned with said additional output module board and substantially identical to said second rear board, said additional second rear board connected to a respective one of said second plurality of connectors and extending towards the rear side of said housing, said additional second rear board having an indicia of said second color.

26. A matrix switcher according to claim 23, wherein said first plurality of connectors includes eighteen connectors and said second plurality of connectors includes eighteen connectors.

* * * * *

UNITED STATES PATENT AND TRADEMARK OFFICE
CERTIFICATE OF CORRECTION

PATENT NO. : 5,990,981
DATED : November 23, 1999
INVENTOR(S) : Edwin S. Thompson, et al.

It is certified that error appears in the above-identified patent and that said Letters Patent are hereby corrected as shown below:

Col. 1, line 46, delete "operations For" and insert -- operations. For --.
Col. 2, line 39, delete "printed-circuit" and insert -- printed circuit --.

Signed and Sealed this

Third Day of April, 2001

Attest:

NICHOLAS P. GODICI

Attesting Officer

Acting Director of the United States Patent and Trademark Office